(12) United States Patent
Natarajan et al.

(10) Patent No.: US 6,179,951 B1
(45) Date of Patent: Jan. 30, 2001

(54) METHOD OF PROTECTING A NON-PLANAR FEATURE USING COMPRESSIVE PADS AND APPARATUS THEREOF

(75) Inventors: Govindarajan Natarajan, Pleasant Valley; John U. Knickerbocker, Hopewell Junction; Suresh D. Kadakia; Abubaker S. Shagan, both of Poughkeepsie, all of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/263,965

(22) Filed: Mar. 5, 1999

(51) Int. Cl.[7] .............................. B32B 31/20; B32B 35/00
(52) U.S. Cl. ..................... 156/285; 156/289; 156/323; 156/580
(58) Field of Search .......................... 156/89.11, 89.12, 156/228, 285, 289, 323, 382, 580, 583.3; 264/241, 313; 425/500

(56) References Cited

U.S. PATENT DOCUMENTS

| | | |
|---|---|---|
| 4,610,741 | 9/1986 | Mase et al. . |
| 4,636,275 | 1/1987 | Norell . |
| 4,680,075 | 7/1987 | McNeal et al. . |
| 4,806,295 | 2/1989 | Trickett et al. . |
| 5,116,440 | 5/1992 | Takeguchi et al. . |
| 5,478,420 | 12/1995 | Gauci et al. . |
| 5,538,582 | 7/1996 | Natarajan et al. . |
| 5,707,476 * | 1/1998 | Bezama et al. . |
| 5,707,480 * | 1/1998 | Bezama et al. . |
| 5,759,320 | 6/1998 | Natarajan et al. . |
| 5,785,800 * | 7/1998 | Natarajan et al. . |
| 5,788,808 | 8/1998 | Natarajan et al. . |
| 5,795,520 | 8/1998 | Scalia et al. . |
| 5,831,810 | 11/1998 | Bird et al. . |
| 5,972,140 * | 11/1999 | Hass et al. . |

OTHER PUBLICATIONS

IBM Technical Disclosure Bulletin, "Fixture For Fabricating Complex Substrate Design From Green Sheet Ceramics", Phillips, vol. 16, No. 11, p. 3559 (Apr. 1974).

* cited by examiner

*Primary Examiner*—Curtis Mayes
(74) *Attorney, Agent, or Firm*—Aziz M. Ahsan

(57) ABSTRACT

The present invention relates generally to a new apparatus and method for forming non-planar surfaces in substrates. More particularly, the invention encompasses an apparatus and a method for fabricating non-planar surfaces in semiconductor substrates wherein at least one zero compression set pad, such as a closed cell porous pad in combination with at least one elastic pad is placed over the non-planar surface prior to lamination and is caused to conform to the contour of the non-planar surface, thus preventing collapse of, or damage to, the non-planar features, such as, shelves or corners during the lamination process. After the lamination process, the zero compression set pad are conveniently removed from the non-planar surface area without causing any damage to the non-planar surface features, such as, shelves or corners or having any paste pull-outs. These zero compression set pads can be reused multiple number of times to form these MLC cavity substrates or similar other structures or features.

29 Claims, 2 Drawing Sheets

METHOD OF PROTECTING A NON-PLANAR FEATURE USING COMPRESSIVE PADS AND APPARATUS THEREOF

FIELD OF THE INVENTION

The present invention relates generally to a new apparatus and method for protecting non-planar features in a substrate, such as, a blind-hole or a through-hole in a semiconductor substrate. The apparatus comprises the insertion of at least one zero compression set pad into a cavity or a non-planar surface in a sheet so that the cavity remains intact during the lamination of the sheet that is being pressed and laminated. The zero compression set pad comprises of at least one solid pad having a pore volume of less than about 2 percent and at least one closed cell porous pad a portion of which is used to form a through-hole or a blind-hole.

BACKGROUND OF THE INVENTION

Semiconductor substrates and devices are becoming smaller and more dense with the evolution of new technologies. However, increases in circuit density produce a corresponding increase in overall manufacturing problems. These manufacturing problems must however be kept to a minimum in order for the semiconductor manufacturer to remain competitive. The semiconductor manufacturers are therefore constantly being challenged to improve the quality of their products by identifying and eliminating defects which produce defective parts or components. Whereas significant improvements are being made to eliminate systematic defects by reducing process variability, process improvements alone are not sufficient to eliminate all the random defects which effect both yield and reliability. Historically, screening techniques have been employed to improve product failure rates to acceptable levels by culling out many of these random defects.

In their desire to improve their products, the semiconductor manufacturers are constantly finding new ways and new techniques to improve or provide new products. It has been found that for some applications, one could make a ceramic carrier or substrate (hereafter just substrate) having a cavity and then have the semiconductor chip placed inside the cavity and secured to the substrate. These semiconductor substrates are often referred to as modules and could be made from a single or a multi-layer ceramic sheet or green sheet forming a single layer ceramic module or a plurality of ceramic layers forming an MLC (multilayer ceramic) module.

While the remaining discussion will be directed to MLC modules, it should be understood that the teachings of the present invention can be equally applicable to single layer modules.

MLC modules having single or multiple cavities are normally used in the electronic industry to package high performance integrated circuits or chips (hereafter just chips). These high performance chips have a large number of external inputs/outputs (called I/Os), such as pads or solder balls, to name a few, and these chips have a very high power dissipation. In order to accommodate such high performance chips, the MLC module also has to provide a high number of external I/Os, such as pads, pins, solder balls, to name a few, and also be able to handle the very high power dissipation that is being generated both from the module as well as the chip. Furthermore, there may also be wire bond pads on the shelves within the cavity.

The single or multiple cavities in an MLC substrate are normally formed by laminating the green sheets during the lamination process typically with the aid of a plug or insert, such as, disclosed in IBM Technical Disclosure Bulletin, "Fixture For Fabricating Complex Substrate Design From Green Sheet Ceramics", Phillips, Vol. 16, No. 11, Page 3559 (April 1974), the disclosure of which is incorporated by reference herein, this contoured laminating fixture with projections that coincide with the recesses in the ceramic substrate, in turn prevents the collapse or deformation of the recesses in the ceramic green sheet during lamination. This method of producing single or multiple cavities requires machining of the inserts with high precision and with high level of surface finish.

Inherently, the cost of such plugs or inserts is very high compared to the cost of the substrate. Additionally, these inserts or plugs do not provide the flexibility of using the same inserts for cavities having various shapes and sizes. Furthermore, placing these inserts in the cavities and then subsequently removing them is an expensive process. It has also been observed that subsequent removing of these inserts, in some cases, has lead to the delamination of the ceramic green sheets or other damage to the green ceramic body. Another drawback with these solid inserts is the need to clean them prior to every use to avoid the paste pull-outs or damage to the green ceramic layers or pads. Even with cleaning of these inserts, paste pull-out often occurs due to the lack of an effective release layer.

Another method of producing these single or multiple cavities in the MLC substrate would be to machine the cavities after the green sheets have been stacked and laminated, but this would not be a cost effective way of producing parts in a high volume manufacturing operation.

It is also possible to form cavities in the MLC substrate with no inserts. This could be done for cases where the lamination conditions are such that there is no resulting deformation in the green ceramic body. In these cases, typically, the lamination pressures are very low and the green sheet formulation is such that the dimensional control of products is achieved by altering the sintering process. However, in a high volume manufacturing operation, tailoring the green sheet formulation and developing a sintering cycle for every product would be cost prohibitive and time consuming. Besides, this approach typically needs an adhesive between layers and multiple lamination steps to achieve the end result. Thus, some of the problems associated with this low pressure lamination process are that no process window for dimensional control is available for the sintered body. Delamination of the ceramic green sheets could happen in sintering due to the removal of the adhesive and the density gradients in the starting structure that are normally present could result in poor substrate dimensional control. Furthermore, there could be substantial increase in stacking and lamination cost and limitation in metal loading on the green sheets to have effective green sheet bonding.

The prior art has approached this problem in other ways as well.

U.S. Pat. No. 4,680,075 (McNeal et al.) and U.S. Pat. No. 4,636,275 (Norell), the disclosures of which are incorporated by reference herein, disclose laminating with a preformed plugs with thermoplastic material such as polyvinyl chloride, polyolefin or a poly carbonate. This plug goes through a plastic deformation at lamination temperature and pressure to fill the cavity.

U.S. Pat. No. 4,737,208 (Bloechle et al.), the disclosure of which is incorporated by reference herein, discloses a method of laminating a printed wiring board (non-ceramic) by utilizing a metallic template (which relieves some of the stresses on the corners of the layers), a fluropolymer (such as TFE) release layer and a putty-like conformal material (for example, flowable and not polymerized rubber) which fills the cavity.

U.S. Pat. No. 5,538,582 (Natarajan, et al.), assigned to International Business Machines Corporation, Armonk, N.Y., USA, and the disclosure of which is incorporated herein by reference, discloses a method for forming cavities in multilayer ceramics without using an insert.

U.S. Pat. No. 5,759,320 (Natarajan, et al.) and No. 5,788,808 (Natarajan, et al.), assigned to International Business Machines Corporation, Armonk, N.Y., USA, and the disclosures of which is incorporated herein by reference, discloses a method and apparatus for forming cavities in multilayer ceramics without using at least one compressive pad.

In every cavity formation technique, it is essential that the material set is chosen such that a cavity profile with sharp corners and flat wire bonding shelves is achieved. When improper plug and/or cavity-fill materials are chosen, the resulting cavity turns out to have rounded edges and corners and/or sloped wire bond shelves and/or paste pullouts, etc.

The present invention, however, solves these and other problems and the result is a ceramic cavity substrate with well-defined features as more fully described in the following description taken along with the accompanying drawings.

PURPOSES AND SUMMARY OF THE INVENTION

The invention is a novel apparatus and insertless method for forming cavity substrates using at least one zero compression set porous pad material.

Therefore, one purpose of the present invention is to provide an apparatus and method that will form cavities in a semiconductor substrate without the necessity of using a solid insert.

Another purpose of the present invention is to provide an apparatus and method that will form deep cavities in a semiconductor substrate without causing damage to the ceramic body or have paste pull-outs.

Yet another purpose of the present invention is the providing of at least one porous zero compression set pad which is used to avoid any damage to the ceramic body and to prevent any paste pull-outs.

Still another purpose of the present invention is to use at least one closed cell porous pad that has pores that are not interconnected and that each cell is an independent pore and naturally filled with air.

Yet another purpose of the present invention is to use at least one solid pad that has a pore volume of less than about 2 percent.

Therefore, in one aspect this invention comprises a method of forming a substrate having at least one non-planar surface, said method comprising:

(a) placing at least one sheet over at least one first plate, wherein at least one of said at least one sheet has at least one non-planar surface, (b) placing at least one substantially planar first pad over said sheet such that at least a portion of said at least one first pad covers at least a portion of said at least one non-planar surface, and wherein said at least one first pad has a compression modules of less than about 40 psi for about 60 percent compression, and an elongation characteristic of greater than about 75 percent at room temperature, (c) placing at least one substantially planar second pad over at least a portion of said first pad, and wherein said at least one second pad has a compression modules of less than about 150 psi for about 30 percent compression, and an elongation characteristic of greater than about 350 percent at room temperature, (d) applying lamination pressure to said at least one first and second pad and said at least one sheet, such that said first pad conforms to the shape of said non-planar surface and prevents the deformation of said non-planar surface during said application of said lamination pressure, and thereby forms said substrate having at least one non-planar surface.

In another aspect this invention comprises an apparatus for forming at least one substrate having at least one non-planar surface, comprising, (a) a first plate to support at least one sheet, wherein at least one of said at least one sheet has at least one non-planar surface, (b) at least one substantially planar first pad over said sheet such that at least a portion of said at least one first pad covers at least a portion of said at least one non-planar surface, and wherein said at least one first pad has a compression modules of less than about 40 psi for about 60 percent compression, and an elongation characteristic of greater than about 75 percent at room temperature, (c) at least one substantially planar second pad over at least a portion of said first pad, and wherein said at least one second pad has a compression modules of less than about 150 psi for about 30 percent compression, and an elongation characteristic of greater than about 350 percent at room temperature, (d) means for applying lamination pressure to cause at least a portion of said first pad to conform to contours of said non-planar surface, and wherein said first pad prevents the deformation of said non-planar surface during said application of said lamination pressure, and thereby forms an apparatus for forming substrate having at least one non-planar surface.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
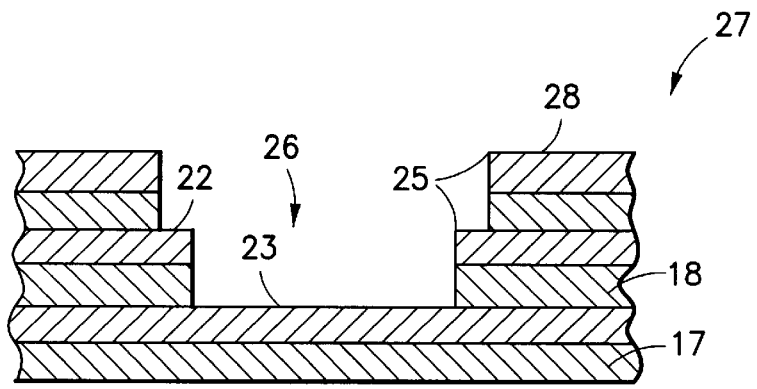
FIG. 1, is a cross-sectional view of a MLC cavity substrate showing undistorted shelves.

Referring now to the Figures in more detail, and particularly referring to FIG. 1, there is shown a MLC (multilayer ceramic) cavity substrate 27, having at least one non-planar surface 26, such as, a cavity 26, and at least one shelf 22. Individual green sheets 17 and 18, such as, ceramic green sheets 17 and 18, are used to build the MLC cavity substrate 27. These green sheets are typically fabricated using a tape casting process which is well known in the art. Briefly, large rolls or sheets of ceramic green sheets (i.e., unfired ceramic layers) are produced, then individual green sheets 17 and 18, are blanked out of these large rolls or sheets of ceramic green sheets. See for example, U.S. Pat. No. 5,795,520 (Scalia, et al.), assigned to International Business Machines Corporation, Armonk, N.Y., USA, and the disclosure of which is incorporated herein by reference, which discloses a method and apparatus for forming and slitting ceramic green sheets. Subsequently, individual ceramic green sheets 18, that will form the cavity 26, are also blanked or an open area 26, is punched appropriately to form the ceramic layers having the cavity 26.

Typically, the material for the ceramic green sheets 17 and 18, is preferably selected from a group comprising alumina, alumina with glass frits, aluminum nitride, aluminum nitride with sintering aids, borosilicate glass and glass ceramic, to name a few, although other ceramic materials may also be used.

Wiring metallurgy, which is also well known in the art, is then applied through a standard screening process onto one or more surfaces of the individual ceramic green sheets 17 and 18, including those parts of the green sheets that will form shelves 22. Base area 23, typically is dedicated for the attachment of a semiconductor element, such as, for example, a chip (not shown), while surface area 28, forms the upper surface of the MLC cavity substrate 27. The shelves 22, typically have pads (not shown) for electrical connection (for example, by wire bonds) to the semiconductor element which is itself secured to the base area 23. See for example, U.S. Pat. No. 5,831,810 (Bird, et al.), assigned to International Business Machines Corporation, Armonk, N.Y., USA, and the disclosure of which is incorporated herein by reference, which discloses a die-receiving cavity, with capacitors positioned on terraced contour of the inner sidewall.

As shown in FIG. 1, the cavity substrate 27, has sharp corners 25, and flat shelves 22, which is difficult to obtain in actual practice due to damage incurred during lamination.

Figure 2:
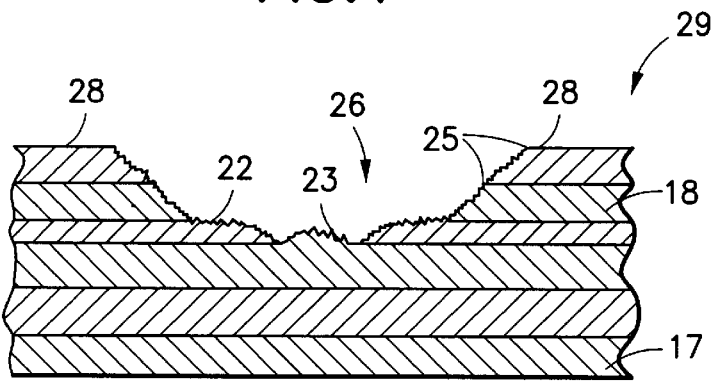
FIG. 2, is a cross-sectional view of a MLC cavity substrate similar to FIG. 1, but showing distorted shelves due to damage incurred during lamination.

FIG. 2, is an exaggerated view of a MLC cavity substrate 29, formed by a prior art process, where the corners 25, became rounded and the shelves 22, became distorted during the lamination process.

Figure 3:
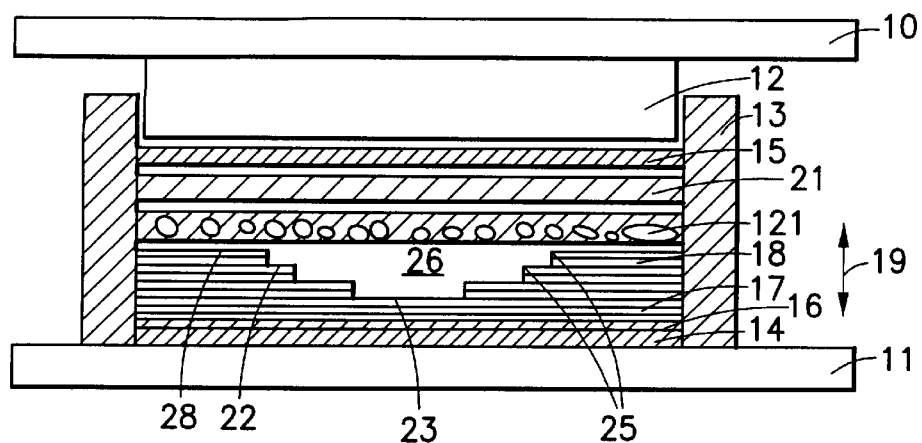
FIG. 3, is a cross-sectional view of a MLC cavity substrate made in accordance with this invention where at least one inventive zero compression set porous pad has been positioned on the sheet having at least one cavity or non-planar surface prior to the lamination process.

Referring now to FIG. 3, which is a cross-sectional view of a MLC cavity substrate 27, prior to the lamination process. Shown is a first or bottom plate 14, placed on which is at least one non-sticky material or non-adhesive layer 16, such as a Mylar layer 16. On the Mylar layer 16, there are cavity forming green sheet layers 17 and 18, that are stacked and which will subsequently form the MLC cavity substrate 27. Layers 17 and 18, are typically of the same material, except that layer 18, has at least one opening 26, that will form the cavity 26. On the upper surface 28, of the layer 18, the inventive zero compression set porous pad or closed cell porous pad (CCPP) 121, is placed while elastic flat pad or solid pad 21, is placed over the zero compression set porous pad 121. Placed on the elastic pad 21, is the second or top lamination plate 15. Typically, the bottom lamination plate 14, and the top lamination plate 15, are made from solid metal plates. The entire stack from bottom lamination plate 14, to the top lamination plate 15, is preferably placed inside a frame 13. The frame 13, helps in preventing the green sheet layers 17 and 18, from sliding during the lamination process. The frame 13, and its contents sit on the first or bottom lamination platen 11. A punch 12, mounted on a second or top lamination platen 10, is used to apply pressure in the direction 19, to the stack within the frame 13, is more clearly shown in FIG. 3, in an open position. For the ease of understanding this inventive process, the various components in the apparatus are shown in FIG. 3, with a separation between them, however, when these items are placed together there is no gap between them.

The zero compression set porous pad 121, could be a combination of one or more thinner pads. As stated earlier that the CCPP (closed cell porous pad) 121, has pores that are not interconnected and that each cell in the CCPP is an independent pore and naturally filled with air. Basically, when the CCPP 121, is being formed as the non-interconnecting pores (not shown) are formed they get filled with ambient or natural air, and therefore when the CCPP 121, is put in a compression environment the non-interconnecting pores act as a cushion to prevent the pad 121, from completely collapsing and also a cushion to the feature, such as the cavity 26, from being collapsed under the lamination pressures. Furthermore, the flat elastic pad 21, could be a combination of one or more thinner elastic flat pads and/or layers 21. It is preferred that the solid pad 21, has a pore volume of less than about 2 percent, so that under compression it transfers the compressive loads to the feature being compressed, such as the different layers 17 and/or 18, of the substrate 27.

Figure 4:
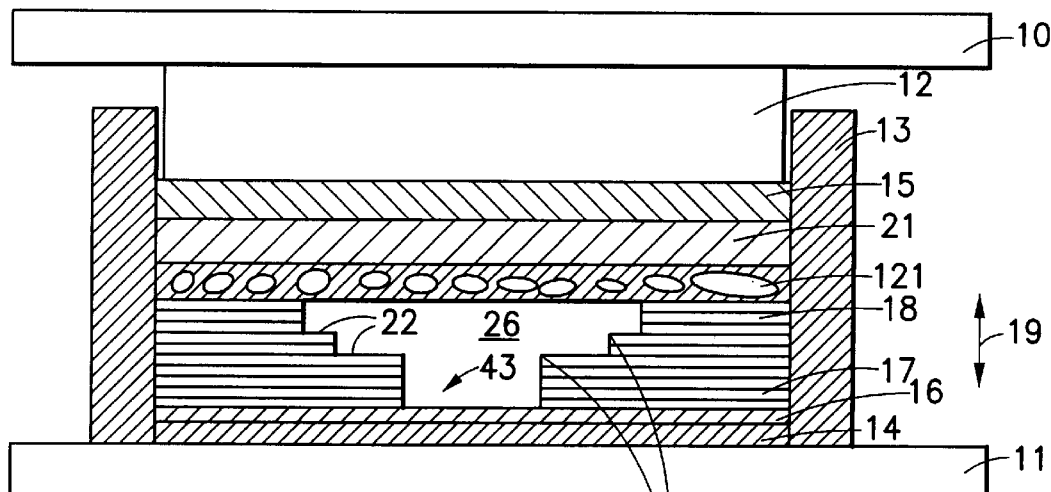
FIG. 4, is a cross-sectional view of the MLC cavity substrate of FIG. 3, during lamination with the inventive zero compression set porous pad in contact with the green sheet laminate with a through-hole but with zero lamination pressure.

FIG. 4, is similar to FIG. 3, except that it shows the total assembly is ready for the lamination process, but just prior to the compression process. The lamination pressure is typically applied to the upper plate 15, which essentially applies the pressure to the stack. The zero compression set porous pad 121, essentially matches the desired profile of the cavity 26, which is shown here as having at least one through-hole or cavity 43. After the green sheets 17 and 18, have been laminated, the zero compression set porous pad 121, can be easily separated from the laminated green sheets 27. It has been found that the removal process of the zero compression set porous pad 121, does not cause any mechanical damage to any of the features of the green laminate 27.

Figure 5:
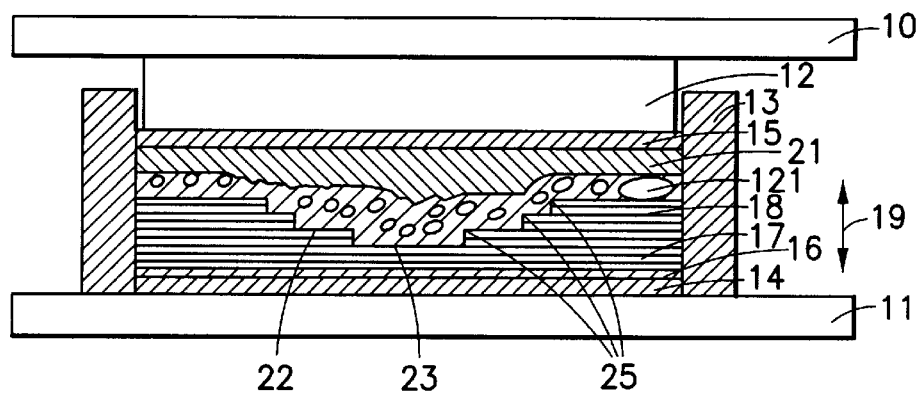
FIG. 5, is a cross-sectional view of the MLC cavity substrate of FIG. 3, during the lamination with the inventive zero compression set porous pad conforming to the surface and the deep cavity of the MLC substrate.

FIG. 5, shows the assembly described in FIGS. 3 and 4, well into lamination cycle. Here the zero compression set porous pad 121, and the elastic flat pad 21, under pressure have completely conformed to the cavity 26. The preferred compression modules of the zero compression set porous pad is less than 40 psi for 60 percent compression and the preferred compression modules of the solid elastic pad 21, is less than 150 psi for 30 percent compression at room temperature. Also the elongation of the elastic flat pad 21, should be better than 350 percent to ensure conformability with no damage to cavity edges and corners 25, and shelf 22, and that of zero compression set porous pad 121, should be better than 75 percent. Higher rate of elongation of the pad 21, with least applied pressure is desirable. The zero compression set porous pad 121, on compression extrudes into the cavity 26, at very low pressure and fills the same, and at the same time, the solid elastic pad 21, helps the porous pad compact very well into the cavity without any damage to the green ceramic body. Once the cavity is filled with the zero compression set porous pad 121, and partially with the solid elastic pad 21, the lamination proceeds as if a planar substrate is being laminated. The lamination pressures usually are above 2000 psi. As can be clearly seen in FIG. 6, that the inventive zero compression set porous pad 121, has completely conformed to the walls and surfaces of the cavity 26, without any damage to any feature on or inside the cavity 26, such as, for example, the sharp corners 25, the shelves or terraced contours 22, etc.

After the MLC cavity substrate 27, of FIG. 3, has been laminated, one can observe that the zero compression set porous pad 121, and the solid elastic compressible pad 21, have sprung back to their original flat shape and furthermore the removal of the pads 21 and 121, from the cavity 26, would be automatic and instantaneous. It should also be noted that any features in and around the cavity 26, or the surface 28, do not get damaged as they are protected by the zero compression set porous pad 121. It should be noted that the elastic compressible pad 21, and the zero compression set porous pad 121, are reusable, and would now be ready for use to form another cavity substrate. It has also been observed that the substrate 27, that is formed using the pads 21 and 121, have undistorted cavities and also have no deleterious effects on the shape or characteristics of the elastic compressible pad 21, and the zero compression set porous pad 121.

Figure 6:
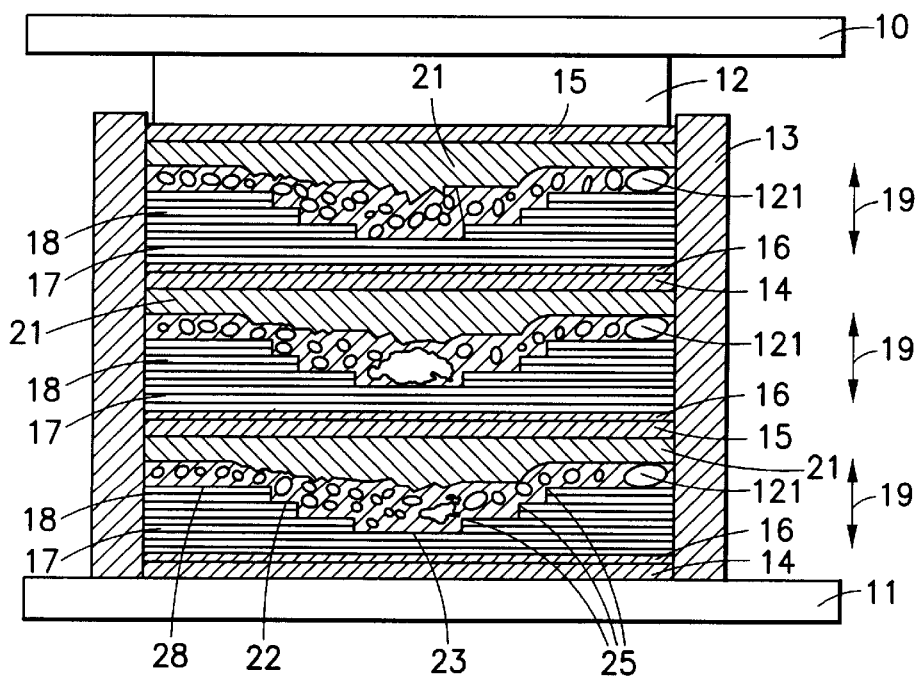
FIG. 6, is a cross-sectional view of another embodiment of this invention where multiple MLC cavity substrates during lamination have individual zero compression set porous pads conforming to the respective cavities or non-planar surfaces.

FIG. 6, is a cross-sectional view of another embodiment of this invention where multiple MLC cavity substrates 27, can be formed using the lamination process of this invention, where individual elastic compressible pads 21, and the zero compression set porous pad 121, are placed on the surface 28, and these pads 21 and 121, conform to the respective cavities during the lamination process. This method allows the making of multiple cavity laminates or substrates 27, in a single lamination cycle. This improvement of course reduces the cycle time per substrate 27, and also reduces the processing cost per substrate 27.

The choice of material for the zero compression set porous pad 121, is important to the present invention. It is preferred that the pad 121, be soft (durometer rating less than Shore A 30), be capable of elongation of greater than 75 percent, and have a low modules of less than 0.1 MPa. The preferred elongation is around 125 percent with a compression modules of 35 psi (at 60 percent compressed) at room temperature. It should also be tough and tear-resistant (50 to 200 PPI). These properties are important so that when the porous pad 121, is caused to conform to the shape of the cavity 26, the sharp corners of the cavity do not become rounded, and the cavity shelves 22, do not become distorted. Suitable material for the closed cell porous pad 121, is a partially or fully cured silicone rubber. Generally speaking, the silicone material is best for all laminating pressures, including laminating at higher pressures above about 2500 psi. Furthermore, the material thickness for the pad 121, is also of importance. The thickness range of between about 10 mils to about 0.5 inches is preferred, however, this would depend on the cavity depth. Above about 0.5 inch the pressure distribution in the cavity area will not be uniform and could result in substrate deformation.

The choice of material for the solid elastic pad 21, is very important for the present invention. The pad 21, should be soft, that is, its durometer rating should be less than about Shore A 30, it should be capable of elongation of greater than at least about 350 percent, it should have a low modules of elasticity, preferably of less than about 0.1 MPa. The preferred elongation is around 800 percent with a compression modules of about 100 psi (at 30 percent compressed) at room temperature it should also be tough and tear-resistant, i.e., it should be between about 50 to about 200 PPI (pounds per inch). These properties are important so that when the flat pad 21, is caused to conform to the shape of the cavity 26, the sharp corners 25, of the cavity 26, do not become rounded, and the cavity shelves 22, do not become distorted. The most suitable material for the elastic pad 21, has been found to be cured silicone rubber. Preferably the pad 21, is a fully or mostly cured thick elastic pad 21. However, generally speaking, silicone material is best for all laminating pressures, including laminating at higher pressures above about 2,500 psi. Furthermore, the material thickness of the pad 21, is also of importance. For most applications it has been found that the thickness of the pad 21, is in the range of between about 10 mils to about 0.25 inches, depending upon the depth of the cavity 26. It is projected that the thickness for the pad 21, of above about 0.25 inch, the pressure distribution in the cavity area 26, would not be uniform and thus could result in the deformation of the substrate.

For blind-holes or cavities 26, that have a depth of more than, say about 40 mils, it is preferred that the closed cell porous pad 121, of this invention is used. However, it has been found that for all products that have a through-hole or cavity 43, the use of the closed cell porous pad(s) 121, avoids any cavity bottom flow-in or a lip in the bottom of the cavity corner.

Closed cell porous pad (CCPP) 121, as used herein means that the pores in the pad 121, are not interconnected and that each cell is an independent pore and naturally filled with air. Therefore, upon heavy load during lamination the CCPP 121, helps to fill the cavity or the blind-hole 26, without any physical damage to the substrate 27, and after the lamination pressures are released the CCPP 121, springs back into its original pad shape for possible reuse. On the other hand, the open porosity material tends to collapse the pores and for some applications are not functionally adequate in cavity or blind-hole formation.

The thickness of the closed cell porous pads 121, and the average size of individual pores of the CCPP 121, are very dependent on the depth of the cavity or the blind-hole 26, and therefore one needs to tailor them for each unique application. For example, it would not be recommended to use a very large pore size pad for a cavity or blind-hole 26, that has a very large depth to width aspect ratio.

The term solid pad 21, as used herein means a pad 21, where the pore volume is less than about 2 percent.

"Zero compression set" (ZCS) as used herein is a measure of resiliency, i.e., that even with extended compression (with specified temperature range) the zero compression set material will spring back to its original shape and properties without any measurable loss in said shape and properties. The specific properties, shape and other conditions have already been discussed in this specification. Therefore, it should be appreciated that both pads 21 and 121, are zero compression set pads within their material characteristics.

The pad 21, is preferably selected from a group comprising of silicone and silicone with additives. These additives for silicone could be selected from a group comprising of alumina, fiber glass, metal particles, metal oxide particles, to name a few.

It is preferred that at least one non-sticky material 16, is placed between the first plate 14, and the ceramic green sheet 17 or 18. This non-adhesive material 16, prevents the adhesion of the ceramic green sheet 17 or 18, to the first plate 14, especially, during the lamination process. This non-sticky material 16, could be a polymer. It is preferred that the non-sticky material 16, is selected from a group comprising elastomer, latex rubber, mylar, polyethylene, to name a few.

The apparatus and method described in FIGS. 3, 4, 5 and 6, use uniaxial lamination. However, the present invention is not restricted by any lamination technique and can be used with any lamination pressure process, such as, for example, hydraulic pressure, hydrodynamic pressure, isostatic pressure, to name a few.

For some applications, the green sheet and/or the pad and/or any other related item, such as, one or more of the plates, could be placed inside at least one environmental enclosure. This environmental enclosure could be a thermal envelope, such as, a furnace. However, this environmental enclosure could be a collapsible bag, such as, a polymeric bag, an elastomeric bag, to name a few. However, this environmental enclosure could also be a fluid barrier container. It should be appreciated that upon evacuation the environmental enclosure could follow the contours of its contents.

The substrate 27, shown in FIG. 1, is illustrative of that obtained by Applicants' inventive apparatus and method. For the ease of understanding the Applicants have used a cavity or blind-hole substrate 27, of FIG. 1, as an example to illustrate Applicants' invention, however, as one can appreciate that the method and apparatus of this invention is applicable to all non-planar surfaces that are a subject of lamination pressures, as the zero compression set porous pad helps in protecting the non-planar surfaces while the rest of the surfaces are being laminated under the lamination pressures.

EXAMPLES

The following examples are intended to further illustrate the invention and are not intended to limit the scope of the invention in any manner.

Example 1

Several samples of multi-layer ceramic bodies containing cavities were fabricated using the process of this invention. In one sample a stack of cavity containing metallized ceramic layers were placed in a lamination frame, and the ceramic layers were separated from the bottom lamination plate by a layer of Mylar, and the second plate by a 0.125 inch thick zero compression set porous pad made of closed cell silicone rubber followed by a 0.125 inch thick silicone rubber pad. The closed cell zero compression set pad had a compression deflection of about 6 psi (compressed 25% at room temperature) with a percent elongation of 125% at break and the thick silicone pad had a compression modules of about 60 psi at 30 percent compressed state (at room temperature) and an elongation of about 900 percent. The assembly was laminated under pressure to about 4200 psi and temperature to about 90° C. in an uniaxial press. After the lamination the cavity substrate was then removed from the frame and inspected. It was found that the cavity and the ceramic body had good dimensional control. More significantly, the zero compression set porous pad had regained its original shape and characteristics for use in subsequent cavity product lamination due to elastic nature of the base material which was partially polymerized.

Example 2

In this example, an assembly of ceramic layers were stacked and laminated in a manner described in Example 1, but the zero compression set porous pad and the solid silicone pad were not used. This sample produced severe cavity deformation and hence was not acceptable as a ceramic chip carrier.

Example 3

In another sample an assembly of ceramic layers were stacked and laminated in a manner described in Example 1, but the silicone rubber pad used was sandwiched in between two zero compression set porous pad approximately 0.125 inches thick. The results were similar to the one obtained in Example 1.

Example 4

In this example, an assembly of ceramic layers were stacked and laminated in a manner described in Example 1, but two layers of zero compression set porous pads of different thicknesses were used. The first pad had a thickness of about 0.065 inch and the second pad had a thickness of about 0.125 inch. The results obtained here again were similar to Example 1.

Example 5

In this example, another assembly of ceramic layers were stacked and laminated in a manner described in Example 1, but the thickness of the silicone pads used were about 0.125 inch thick and the zero compression set porous pad was placed above the solid silicone pad (instead of on the cavity). In this case the results obtained were not acceptable. The cavity substrate that was produced showed sloped shelves in the cavity and the bottom of the deep cavity was also not flat.

Example 6

In this example, an assembly of ceramic layers were stacked and laminated in a manner described in Example 1, but the silicone pads used were harder than the ones used in Example 1. The elongation characteristic of the pad was about 400 percent and compression modules was about 130 psi, at room temperature. Here again the cavity definition and substrate dimensions were good.

Example 7

In this example, an assembly of ceramic layers were stacked and laminated in a manner described in Example 1, but the silicone pads used were softer than the ones used in Example 1. The elongation characteristic of the pad was about 300 percent and compression modules was about 120 psi, at room temperature. In this case the cavity profile of the product that was obtained was not well defined as it had sloped shelves and rounded cavity edges.

Example 8

In this example, an assembly of ceramic layers were stacked and laminated in a manner described in Example 1, but there were three such assemblies within the lamination frame. Here again the cavity definition and substrate dimensions of all three laminates were very good.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of forming a substrate having at least one non-planar surface, said method comprising:
   (a) placing at least one sheet over at least one first plate, wherein at least one of said at least one sheet has at least one non-planar surface,
   (b) placing at least one substantially planar first pad over said sheet such that at least a portion of said at least one first pad covers at least a portion of said at least one non-planar surface, and wherein said at least one first pad has a compression modulus of less than about 40 psi for about 60 percent compression, and an elongation characteristic of greater than about 75 percent at room temperature,
   (c) placing at least one substantially planar second pad over at least a portion of said first pad, and wherein said at least one second pad has a compression modulus of less than about 150 psi for about 30 percent compression, and an elongation characteristic of greater than about 350 percent at room temperature,
   (d) applying lamination pressure to said at least one first and second pad and said at least one sheet, such that said first pad conforms to the shape of said non-planar surface and prevents the deformation of said non-planar surface during said application of said lamination pressure, and thereby forms said substrate having at least one non-planar surface.

2. The method of claim 1, wherein said at least one first pad is at least one closed cell porous pad.

3. The method of claim 1, wherein said at least one first pad is at least one closed cell porous pad and is a fully or mostly cured thick elastic pad.

4. The method of claim 1, wherein said at least one first pad is selected from a group consisting of silicone and silicone with additives.

5. The method of claim 4, wherein said additives for silicone are selected from a group consisting of alumina, fiber glass, metal particles and metal oxide particles.

6. The method of claim 1, wherein said at least one second pad is at least one solid pad having a pore volume of less than about 2 percent.

7. The method of claim 1, wherein said at least one second pad is at least one solid pad having a pore volume of less than about 2 percent and is a fully or mostly cured thick elastic pad.

8. The method of claim 1, wherein said at least one second pad is selected from a group consisting of silicone and silicone with additives.

9. The method of claim 8, wherein said additives for silicone are selected from a group consisting of alumina, fiber glass, metal particles and metal oxide particles.

10. The method of claim 1, wherein said at least one second pad has a tear resistance of at least about 50 PPI.

11. The method of claim 1, wherein said sheet comprises at least one green sheet.

12. The method of claim 1, wherein said sheet comprises at least one green sheet, and wherein material for said green sheet is selected from a group consisting of alumina, alumina with glass frits, aluminum nitride, aluminum nitride with sintering aids, borosilicate glass or glass ceramic.

13. The method of claim 1, wherein at least one non-sticky material is placed between said first plate and said at least one sheet.

14. The method of claim 13, wherein said at least one non-sticky material comprises at least one polymer.

15. The method of claim 13, wherein said at least one non-sticky material is selected from a group consisting of elastomer, latex rubber, polyethylene terephthalate or polyethylene.

16. The method of claim 1, wherein said at least one first and second pads and said at least one sheet are contained within at least one frame.

17. The method of claim 1, wherein said lamination pressure is less than about 2,000 psi.

18. The method of claim 1, wherein said lamination pressure is more than about 2,000 psi.

19. The method of claim 1, wherein said lamination pressure is selected from a group consisting of isostatic pressure, hydrodynamic pressure and hydraulic pressure.

20. The method of claim 1, wherein said at least one sheet and said first pad and said second pad are inside at least one environmental enclosure.

21. The method of claim 20, wherein said environmental enclosure is selected from a group consisting of a thermal envelope, a collapsible bag, a fluid barrier container, a polymeric bag or an elastomeric bag.

22. The method of claim 1, further comprising prior to applying said lamination pressure, of placing at least one second plate over said at least one second pad, such that during said step of applying said lamination pressure at least one of said first plate and at least one of said second plate moves closer to one another.

23. The method of claim 22, wherein said at least one first and said second plates and their contents are placed inside at least one environmental enclosure.

24. The method of claim 23, wherein said at least one first and said second plates and their contents are placed inside at least one environmental enclosure and upon evacuation said environmental enclosure follows the contours of its contents.

25. The method of claim 23, wherein said environmental enclosure is selected from a group consisting of a thermal envelope, a collapsible bag, a fluid barrier container, a polymeric bag or an elastomeric bag.

26. The method of claim 1, further comprising after applying said lamination pressure of removing said at least one first pad from said non-planar surface.

27. The method of claim 1, wherein said at least one sheet is pre-heated prior to said application of said lamination pressure.

28. The method of claim 1, wherein said at least one non-planar surface is selected from a group comprising at least one blind-hole or a through-hole.

29. An apparatus for forming at least one substrate having at least one non-planar surface, comprising,
   (a) a first plate to support at least one sheet, wherein at least one of said at least one sheet has at least one non-planar surface,
   (b) at least one substantially planar first pad over said sheet such that at least a portion of said at least one first pad covers at least a portion of said at least one non-planar surface, and wherein said at least one first pad has a compression modulus of less than about 40 psi for about 60 percent compression, and an elongation characteristic of greater than about 75 percent at room temperature, (c) at least one substantially planar second pad over at least a portion of said first pad, and wherein said at least one second pad has a compression modulus of less than about 150 psi for about 30 percent compression, and an elongation characteristic of greater than about 350 percent at room temperature, (d) means for applying lamination pressure to cause at least a portion of said first pad to conform to contours of said non-planar surface, and wherein said first pad prevents the deformation of said non-planar surface during said application of said lamination pressure, and thereby forms an apparatus for forming substrate having at least one non-planar surface.

* * * * *